(12) United States Patent
Flachowsky et al.

(10) Patent No.: US 8,735,241 B1
(45) Date of Patent: May 27, 2014

(54) SEMICONDUCTOR DEVICE STRUCTURE AND METHODS FOR FORMING A CMOS INTEGRATED CIRCUIT STRUCTURE

(71) Applicant: GLOBALFOUNDRIES Inc., Grand Cayman (KY)

(72) Inventors: Stefan Flachowsky, Dresden (DE); Ralf Richter, Radebeul (DE); Roman Boschke, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/747,972

(22) Filed: Jan. 23, 2013

(51) Int. Cl.
*H01L 21/8238* (2006.01)

(52) U.S. Cl.
USPC .......................................... 438/199; 438/219

(58) Field of Classification Search
CPC ................... H01L 29/7848; H01L 21/823807; H01L 29/66636; H01L 21/823814
USPC .................................. 438/199, 219
See application file for complete search history.

(56) References Cited

U.S. PATENT DOCUMENTS

| | | |
|---|---|---|
| 7,678,634 B2 | 3/2010 | Ouyang et al. |
| 2007/0096149 A1* | 5/2007 | Liu et al. .................... 257/192 |
| 2011/0223737 A1* | 9/2011 | Liu et al. .................... 438/308 |
| 2012/0231591 A1 | 9/2012 | Flachowsky et al. |
| 2012/0292637 A1* | 11/2012 | Beyer et al. .................. 257/77 |
| 2012/0302019 A1* | 11/2012 | Cheng et al. ................ 438/217 |
| 2013/0069123 A1* | 3/2013 | Illgen et al. ................. 257/288 |
| 2013/0178024 A1* | 7/2013 | Flachowsky et al. ......... 438/199 |
| 2013/0337621 A1* | 12/2013 | Cheng et al. ................ 438/199 |

* cited by examiner

*Primary Examiner* — Ngan Ngo
(74) *Attorney, Agent, or Firm* — Amerson Law Firm, PLLC

(57) ABSTRACT

Methods for forming CMOS integrated circuit structures are provided, the methods comprising performing a first implantation process for performing at least one of a halo implantation and a source and drain extension implantation into a region of a semiconductor substrate and then forming a stressor region in another region of the semiconductor substrate. Furthermore, a semiconductor device structure is provided, the structure comprising a stressor region embedded into a semiconductor substrate adjacent to a gate structure, the embedded stressor region having a surface differing along a normal direction of the surface from an interface by less than about 8 nm, wherein the interface is formed between the gate structure and the substrate.

13 Claims, 9 Drawing Sheets

SEMICONDUCTOR DEVICE STRUCTURE AND METHODS FOR FORMING A CMOS INTEGRATED CIRCUIT STRUCTURE

BACKGROUND OF THE INVENTION

1. Field of the Invention

The present invention generally relates to methods for forming a CMOS integrated circuit structure and to a semiconductor device structure, and, more particularly, to methods for forming a CMOS integrated circuit structure having a strained PMOS device and to strained semiconductor device structures.

2. Description of the Related Art

The majority of present-day integrated circuits (ICs) are implemented by using a plurality of interconnected field effect transistors (FETs), also called metal oxide semiconductor field effect transistors (MOSFETs), or simply MOS transistors. Conventionally, present-day integrated circuits are implemented by millions of MOS transistors which are to be formed on a chip having a given surface area. An often-used technology for constructing present-day integrated circuits is provided by complementary metal oxide semiconductor (CMOS) technology. Current IC designs making use of CMOS technologies use complementary and symmetrical pairs of P-type metal oxide semiconductor field effect transistors, also called P-channel MOS transistors or PMOS transistors, and N-type metal oxide semiconductor field effect transistors, also called N-channel MOS transistors or NMOS transistors, for implementing logic functions and building varieties of logic structures.

The trend in IC fabrication is to incorporate more and more logic circuit structures on a single chip and to simultaneously improve the performance of the logic circuit structures. Consequently, a given area taken by logic circuitry on a chip has been steadily decreased, resulting in a scaling of the MOS structures and devices implementing logic circuit structures. However, scaling does not only enable improvement of chip performance, but also raises more and more challenges to cope with when scaling down MOS structures and devices to smaller dimensions.

One way of improving the performance of present-day circuits is achieved by techniques that apply mechanical stress to individual transistors to induce strained regions in the transistor. In particular, properly induced strain may be used to increase the mobility of majority carriers (holes for a PMOS transistor and electrons for an NMOS transistor) in the channel of a MOS transistor. One way to provide the proper strain is to form dual stress layers (DSL), sometimes also called "dual stress liners," overlying the transistors. Tensile stress layers are formed over NMOS transistors and compressive stress layers are formed over PMOS transistors. The mobility of holes in the channel of PMOS transistors may be further increased by embedding silicon germanium at the ends of the channel to impart a compressive stress on the channel, while it is possible to further increase the mobility of electrons in the channel of NMOS transistors by embedding silicon carbide at the ends of the channel to impart a tensile stress on the channel.

In conventional CMOS fabrication techniques, silicon germanium stressor regions are embedded at the ends of the channel of a PMOS transistor after gate electrode formation. Subsequently, PMOS implants for forming halo regions and/or source and drain extension regions are performed, followed by NMOS implant steps for forming halo regions and/or source and drain extension regions.

An illustrative technique according to the prior art will be explained with regard to FIGS. 1a-1e. As illustrated in FIG. 1a, fabrication of a CMOS integrated circuit 100 begins by providing a semiconductor substrate 102, such as a silicon substrate. A PMOS region 104 is formed in one portion of semiconductor substrate 102 and an NMOS region 106 is formed in another portion. The two regions are separated by an electrical isolation structure, such as a shallow trench isolation (STI) 108. A gate electrode structure 110 of a PMOS transistor 111 overlies the PMOS region 104 and a gate electrode structure 112 of an NMOS transistor 113 overlies the NMOS region 106. The gate electrode structure 110 includes a gate insulator 114 and a conductive gate electrode 116. The gate electrode structure 112 includes a gate insulator 118 and a conductive gate electrode 120. Illustrative gate insulators are given by silicon dioxide, a high-k dielectric constant insulator or any other appropriate insulating material known to the person skilled in the art. The conductive gate electrodes 116 and 120 may be, for example, polycrystalline silicon or metal. The person skilled in the art appreciates that, depending on the exact process, a thin silicon-nitride (SiN) liner may be used to cover and protect a high-k/metal gate structure when performing gate-first integration.

As illustrated in FIG. 1b, the fabrication of CMOS IC 100 continues by forming sidewall spacers 122 on the sidewalls of the gate electrode structure 110. Conventionally, the sidewall spacers 122 may be silicon dioxide or silicon nitride and may be formed by blanket depositing a layer of sidewall spacer material 123 followed by an anisotropic etch process, such as reactive ion etching (RIE). During the etching of the sidewall spacers, the sidewall spacer material 123 overlying the NMOS region 106 is protected from the anisotropic etch by a photolithographically patterned etch mask 126, such as a patterned photoresist.

In accordance with the prior art fabrication technique, recesses 124 are subsequently etched into the PMOS region 104 using the gate electrode structure 110 and its associated sidewall spacer 122 as etch masks. The NMOS region 106 is protected during the recess etch process (not illustrated) by the photolithographically patterned etch mask 126 such that the recesses 124 are aligned to the gate electrode structure 110 of the PMOS transistor 111. As illustrated in FIG. 1b, recesses 124 border on the STI 108.

Following the etching of the recesses 124, the etch mask 126 is removed and the recesses 124 are filled with silicon germanium material to form embedded silicon germanium (eSiGe) 128 as illustrated in FIG. 1c. The eSiGe 128 may be grown by a process of selective epitaxial growth as is well known to those skilled in the art. The crystalline material bounding the recesses 124 acts as a nucleation site for the growth of single crystalline silicon germanium in the selective epitaxial growth process. If the conductive gate electrode 116 is of polycrystalline silicon, the polycrystalline silicon acts as a nucleation site for the deposition of polycrystalline silicon germanium 129. No silicon germanium grows on the insulating layers, such as the sidewall spacers 122, the remaining portion of the sidewall spacer material 123 overlying the NMOS region 106 and the STI 108, because of the growth process being selective. After the growth of eSiGe 128, the sidewall spacer 122 and the remaining portion of the sidewall spacer material 123 may be removed.

As illustrated in FIG. 1d, source and drain extension regions 132 are formed in alignment with the gate electrode structure 110 having sidewall spacers 134 formed at each side of the gate electrode structure 110. The source and drain extension regions 132 are formed by an ion implantation step 162 for implanting boron ions into the PMOS region 104 and into eSiGe 128. The NMOS transistor 113 is at the same time protected by a photolithographically formed resist mask 136 covering the gate electrode structure 112 and sidewall spacers 134 in the NMOS region 106 such that, in this processing phase, source and drain extension regions 132 are formed in the PMOS region 104.

Subsequent to the formation of source and drain extension regions 132 in the PMOS region 104, an according source and drain extension implant process 164 is applied to the NMOS transistors 113 as illustrated in FIG. 1e. While performing the source and drain extension implant step 164 in the NMOS region 106, the PMOS transistor 111 is protected and covered by a resist mask 146 which is formed over the PMOS region 104 by means of conventional photolithography techniques prior to performing the implantation step 164. As a result, source and drain extension regions 153 are formed in the NMOS region 106 in alignment with the gate electrode structure of NMOS 113.

The CMOS fabrication method as explained with regard to FIGS. 1a-1e exemplifies the CMOS fabrication for a single CMOS device. However, as noted above, conventional ICs are implemented by millions of MOS structures and devices which are designed in dependence of the application of the chip under fabrication. Depending on the design of the device under fabrication, the implemented IC may not only include one type of logic circuitry, such as SRAM, but may also include other logic devices, such as thick gate oxide devices for input/output applications and special devices with lower or higher threshold voltages, so-called low-Vth or high-Vth transistors, etc. In consequence, the actual number of implantations performed in typical CMOS fabrication flows may differ from 6-10 different implantation processes for source and drain extension implantations performed after formation of silicon germanium regions in typical CMOS fabrication flows. Each implantation requires a resist mask to protect the other devices during the implantation, the resist mask being removed after each implantation process by using a plasma strip process, for example, and subsequently applying a passivation cleaning process. Both processes, the strip process and the passivation cleaning process, inherently consume a small amount of the surface silicon in order to efficiently clean the substrate surface. However, this small amount of consumed surface adds up to a significant amount of active silicon loss which is even severe for silicon germanium since its etching rate is higher as compared to silicon.

FIG. 1f shows the PMOS device 111 after formation of sidewall spacer 184 and implantation of source and drain 192 into PMOS region 104. Spacer 184 corresponds to a spacer 1 structure used for aligning source and drain 192, while spacer 182 corresponds to a spacer 0 structure, used for implanting source and drain extension regions 132. The gate electrode structure 180 schematically represents a gate electrode stack according to gate-first techniques or a dummy gate electrode in accordance with gate-last or replacement gate techniques.

As illustrated in FIG. 1f, the amount of active silicon loss around the gate electrode structure 180 is represented by an arrow H representing a difference in surface level heights of the substrate surface at source and drain 192 (its extension being indicated in FIG. 1f by a broken line in order to allow visually relating both surface levels to each other) and the substrate surface above which the gate electrode structure 180 is disposed. The inventors observed that conventional fabrication steps as explained above amount to the active silicon loss H of around 8 nm resulting from the cleaning and passivation steps performed in between gate formation and spacer 1 formation during conventional CMOS fabrication flows.

As illustrated in FIG. 1f, the active silicon loss H around the gate electrode structure 180 of PMOS transistor 111 in PMOS region 104 results in a depression of the substrate surface around the gate electrode structure 180. Due to the depression of the substrate surface around the gate electrode structure 180, a warped current flow is expected to occur in the PMOS transistor 111 during operation, which is indicated in FIG. 1f by an arrow A. The person skilled in the art will understand that the depression of the substrate surface around the gate electrode structure 180 of PMOS transistor 111, therefore, contributes to an increased parasitic resistance of PMOS transistor 111. In general, depressions of substrate surfaces around gate electrodes of PMOS transistors as caused in conventional CMOS fabrication flows, therefore, reduce the on-current and switching speed of conventional PMOS transistors and, accordingly, of conventional CMOS structures and devices.

In view of the above discussion, there exists a need for methods of fabricating a CMOS integrated circuit structure and of semiconductor device structures providing CMOS structures with higher on-current and higher switching speed. Furthermore, there exists a need for PMOS integrated circuit structures with enhanced curing and switching characteristics as compared to conventional PMOS structures.

Particularly, there exists a need for methods of forming CMOS integrated circuit structures and a semiconductor device structure with enhanced performance and, in particular, for structures having a reduced amount of active silicon loss around the gate electrode, or even avoid any active silicon loss around the gate electrode.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to the present disclosure, methods for forming CMOS integrated circuit structures comprise performing a first implantation process for performing at least one of a halo implantation process and a source and drain extension implantation process into a region of a semiconductor substrate and then forming a stressor region in another region of the semiconductor substrate. In special illustrative embodiments herein, the stressor region is formed in a PMOS region of the semiconductor substrate.

According to the present disclosure, a semiconductor device structure comprises a stressor region embedded into a semiconductor substrate adjacent to a gate structure, the embedded stressor region having a surface differing along a normal direction of the surface from an interface by less than about 8 nm or less than about 1.8 nm or less than 1 nm, wherein the interface is formed between the gate structure and the substrate.

In one aspect, the present disclosure provides a method for forming a CMOS integrated circuit structure, wherein the method comprises providing a semiconductor substrate with a first transistor region and a second transistor region, each having a gate structure, forming a first masking structure over the semiconductor substrate, masking the first transistor region while exposing at least a portion of the second transistor region, performing a first implantation process comprising at least one of a halo implantation and a source and drain extension implantation into the exposed portion of the second transistor region, removing the first masking structure, and thereafter forming a second masking structure over the semiconductor substrate, the second masking structure masking the second transistor region while exposing at least a portion of the first transistor region. The method further comprises forming a stressor portion within the exposed portion of the first transistor region and forming an N-type source and drain in the second transistor region.

According to a further aspect of the present disclosure, a method of forming a CMOS integrated circuit structure is provided, wherein the method comprises providing at least one P-well region and at least one N-well region in a semiconductor substrate, forming a first mask over the at least one N-well region, the first mask exposing at least a portion of at least one P-well region, performing a first implantation process for forming at least one of halo regions and source and drain extension regions in the exposed portion of the at least one P-well region, removing the first mask, forming a second mask over the at least one P-well region, the second mask exposing at least a portion of at least one N-well region, and forming one or more stressor regions in the exposed portion of the at least one N-well region.

According to another aspect of the present disclosure, a semiconductor device structure is provided, the structure comprising a semiconductor substrate with a first region, a first gate structure formed in the first region defining a gate surface portion on the substrate and at least one stressor region embedded into the substrate adjacent to the first gate structure, the stressor region defining a stressor region surface on the substrate. A difference in the height between the gate surface portion and the stressor region surface along a direction normal to the substrate surface is less than about 8 nm.

Certain embodiments of the present disclosure have other aspects in addition to or in place of those mentioned or which are obvious from the above said. The aspects will become apparent to those skilled in the art from reading the following detailed description when taken with reference to the accompanying drawings.

BRIEF DESCRIPTION OF THE DRAWINGS

The disclosure may be understood by reference to the following description taken in conjunction with the accompanying drawings, in which like reference numerals identify like elements, and in which.

Figure 1A:
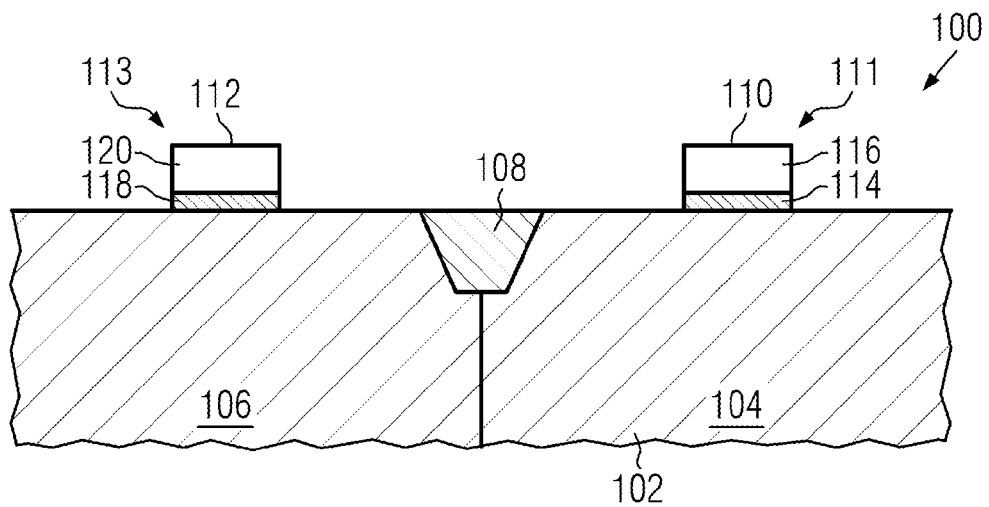
FIGS. 1a-1e schematically illustrate in a cross-sectional view a conventional flow for fabricating a CMOS structure according to the prior art.
Figure 1B:
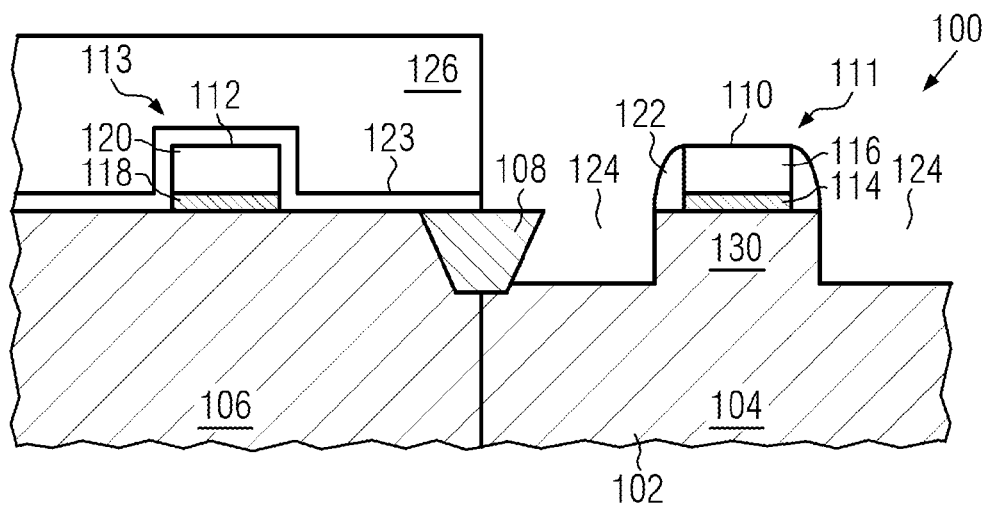
Figure 1C:
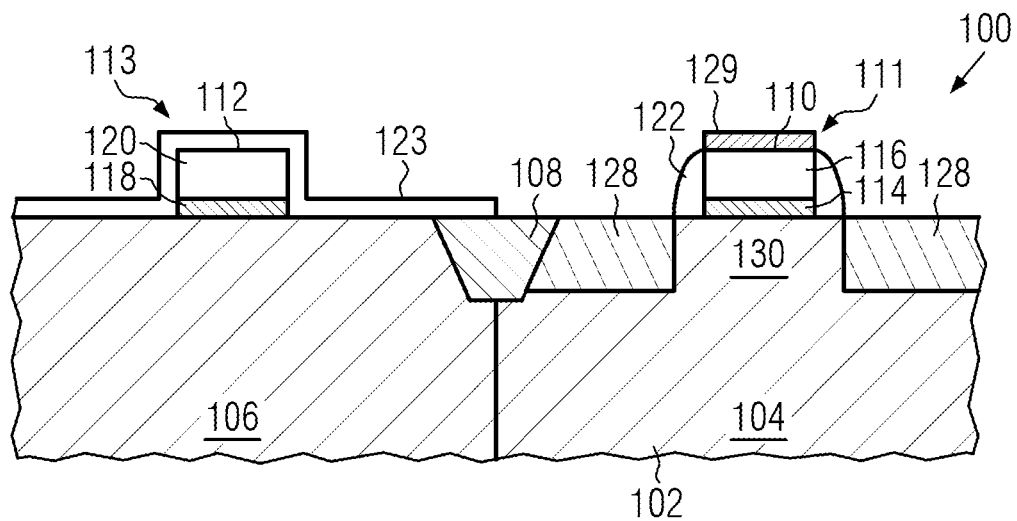
Figure 1D:
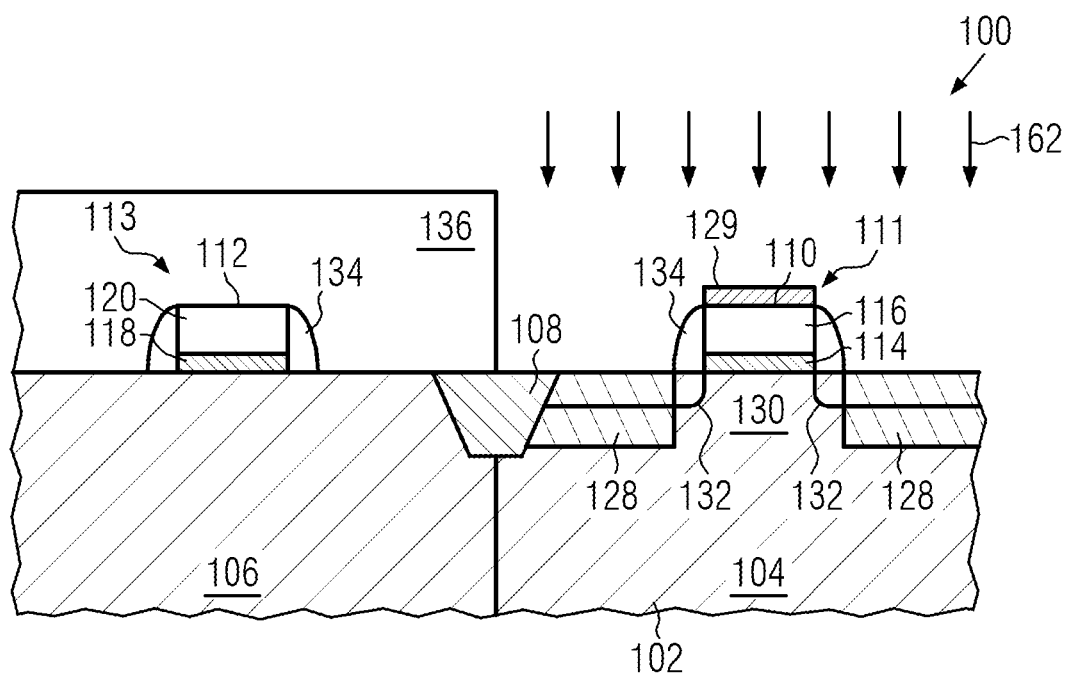
Figure 1E:
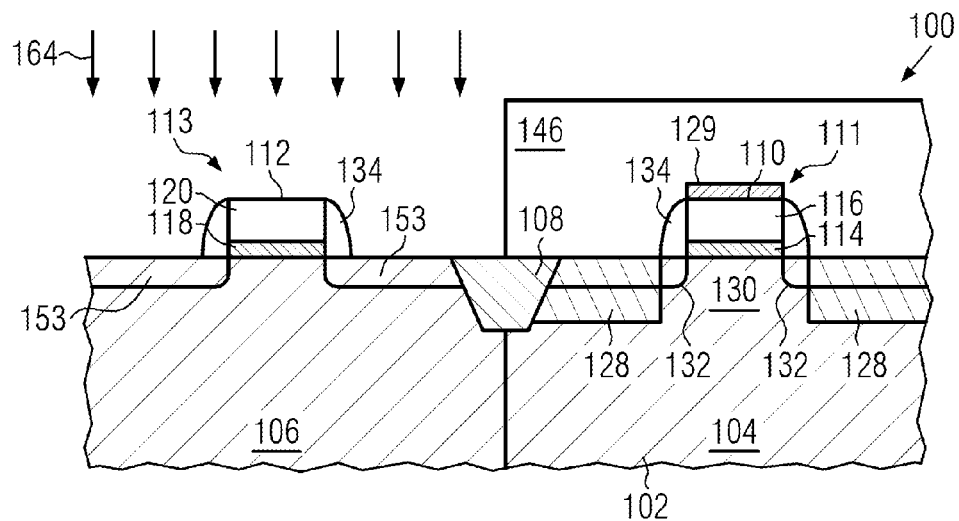
Figure 1F:
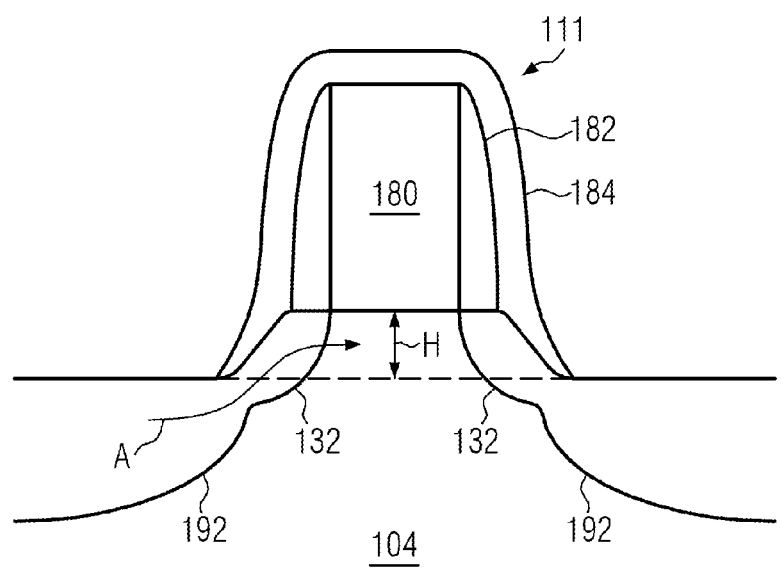
FIG. 1f schematically illustrates in a cross-sectional view a conventional PMOS device after source and drain regions are formed according to the prior art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

The following detailed description is merely exemplary in nature and is not intended to limit the disclosure or the application and merely illustrates aspects of the disclosure. Furthermore, there is no intention to be bound by any expressed or implied theory presented in the preceding technical field, background, brief summary or the following detailed description.

The following embodiments are described in sufficient detail to enable those skilled in the art to make and use the invention. It is to be understood that other embodiments would be evident based on the present disclosure and that system, structure, process or mechanical changes may be made without departing from the scope of the present disclosure. In the following description, numerous specific details are given to provide a thorough understanding of the disclosure. However, it will be apparent that the various illustrated aspects and embodiments of the disclosure may be practiced without these specific details. In order to avoid obscuring the present disclosure, some well-known circuits, system configurations, structure configurations and process steps are not disclosed in full detail.

The drawings showing embodiments of the present disclosure are semi-diagrammatic and are not to scale and, particularly, some of the dimensions are for clarity of presentation only and, therefore, are exaggeratedly shown in the drawings. Similarly, although the views in the drawings generally show similar orientations for ease of description, this depiction in the drawings is arbitrary for the most part. Generally, the embodiments of the disclosure may be operated in any orientation.

The multiple embodiments are disclosed and described having some features in common, for clarity and ease of illustration, description and comprehension thereof, similar and like features are ordinarily described with similar reference numerals as a matter of descriptive convenience. Various different embodiments are described with regard to one or more common figures as a matter of descriptive convenience. It is to be understood that this is not intended to have any other significance or provide any limitation for the present disclosure. Any numeration of embodiments, may it be explicit as $1^{st}$ embodiment, $2^{nd}$ embodiment, etc., or implied, is a matter of descriptive convenience and is not intended to provide any other significance or limitation for the present disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressly set forth in the specification in a definitional manner that directly and unequivocally provides the special definition for the term or phrase.

Integrated circuits (ICs) may be designed with millions of transistors. Many ICs are designed using metal oxide semiconductor (MOS) transistors, also known as field effect transistors (FETs) or MOSFETs. Although the term "MOS transistor" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. The person skilled in the art understands that MOS transistors may be fabricated as P-channel MOS transistors or PMOS transistors and as N-channel transistors or NMOS transistors, and both may be fabricated with or without mobility enhancing stressor features or strain-inducing features. The person skilled in the art understands that stress and strain are related via tensile modulus. A circuit designer can mix and match device types, using PMOS and NMOS transistors, stressed and unstressed, to take advantage of the best characteristics of each device type as they best suit the circuit being designed.

According to some aspects of the present disclosure, methods for forming a CMOS integrated circuit structure are provided according to which embedded silicon germanium is formed in PMOS regions of a semiconductor substrate after performing source and drain extension implants and/or halo region implants in NMOS regions of the semiconductor substrate. According to certain embodiments herein, the formation of stressor regions, for example comprising embedded silicon germanium, in the PMOS region of the semiconductor device may take place in the CMOS fabrication flow subsequent to forming source and drain extension regions and/or halo regions in the NMOS region of the semiconductor substrate and preceding the implantation processes for forming source and drain extension regions and/or halo regions in the PMOS region of the semiconductor substrate. According to alternative embodiments herein, the formation of stressor regions, for example comprising embedded silicon germanium, may take place subsequent to implanting source and drain extension regions and/or halo regions in the PMOS region of the semiconductor substrate.

According to another aspect of the present disclosure, a semiconductor device structure is provided, the semiconductor device structure having a semiconductor substrate with a gate structure formed in the semiconductor substrate, the gate structure defining a gate surface portion on the substrate, and at least one stressor region embedded into the substrate adjacent to the gate structure, the stressor region defining a stressor region surface on the substrate. A difference in the height between the gate surface portion and the stressor region surface along a direction normal to the substrate surface may be less than about 8 nm.

In describing the following figures, methods for forming a CMOS integrated circuit (IC) structure and/or according structures of integrated circuits (ICs) in accordance with various exemplary embodiments of the present disclosure and various embodiments of semiconductor device structures of the present disclosure will be illustrated. The described process steps, procedures, and materials are to be considered only as exemplary embodiments designed to illustrate to one of ordinary skill in the art methods for practicing the invention. However, it is to be understood that the invention is not to be limited to these exemplary embodiments. Illustrated portions of IC structures may include only a single CMOS IC structure, although those skilled in the art will recognize that an actual IC may include a large number of such structures. The illustrated MOS transistors in accordance with the present disclosure may be similar to the MOS transistors 111 and 113 which are described above. Various steps in the manufacture of IC structures are well known and so, in the interests of brevity, many conventional steps will only be mentioned briefly herein or will be omitted entirely without providing the well-known process details.

FIGS. 2a-2g illustrate schematically, in cross-sectional views, method steps designed and used to reduce aforementioned problems during the fabrication of CMOS integrated circuit (IC) structures in accordance with various embodiments of the present disclosure. Only two transistor structures, one NMOS transistor structure and one PMOS transistor structure, are illustrated in the figures, although those of skill in the art will appreciate that a CMOS IC structure may include a large number of each type of device, e.g., millions of transistors.

Figure 2A:
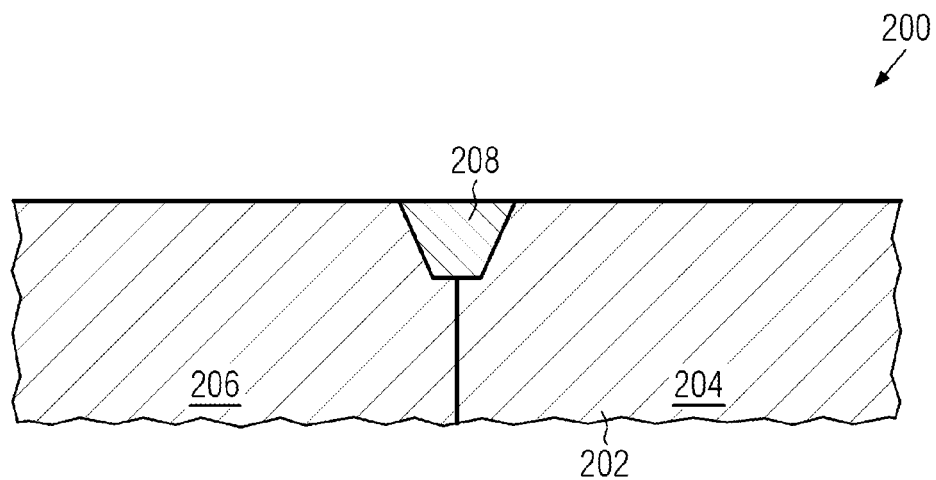
FIGS. 2a-2g schematically illustrate embodiments of the present disclosure with regard to methods for fabricating a CMOS integrated circuit structure according to aspects of the present disclosure and semiconductor device structures according to embodiments of the present disclosure.

As illustrated in FIG. 2a, fabrication of a CMOS integrated circuit 200 begins by providing a semiconductor substrate 202. The semiconductor substrate 202 may be silicon, silicon admixed with germanium, or silicon admixed with other elements, as is common in the semiconductor industry, and, for convenience, will hereinafter be referred to simply as either a semiconductor or silicon substrate. The substrate may be a bulk silicon wafer (as illustrated) or a silicon-on-insulator (SOI) structure. In an SOI structure, the semiconductor substrate 202 is a thin layer of monocrystalline semiconductor material supported by an insulating layer which, in turn, is supported by a supporting substrate.

As shown in FIG. 2a, a PMOS region 204 is formed in one portion of the semiconductor substrate 202 and an NMOS region 206 is formed in another portion of the semiconductor substrate 202. The two regions 204 and 206 may be separated by an electrical isolation structure such as, for example, a shallow trench isolation (STI) region 208. In an SOI structure, the STI region 208 could extend through the semiconductor layer to the underlying insulating layer. The PMOS region 204 may be doped with N-type conductivity determining dopant impurities, such as phosphorus or arsenic, for forming an N-well region. However, the person skilled in the art will appreciate that the PMOS region 204 may alternatively remain undoped or be only lightly doped. The NMOS region 206 is doped with a P-type conductivity determining dopant impurity, such as boron, for forming a P-well region. However, the person skilled in the art will appreciate that the NMOS region 206 may alternatively remain undoped or only be doped to a light degree. The correct doping concentration and doping profile in each of the regions 206 and 204 may be established, for example, by multiple ion implantation processes.

Figure 2B:
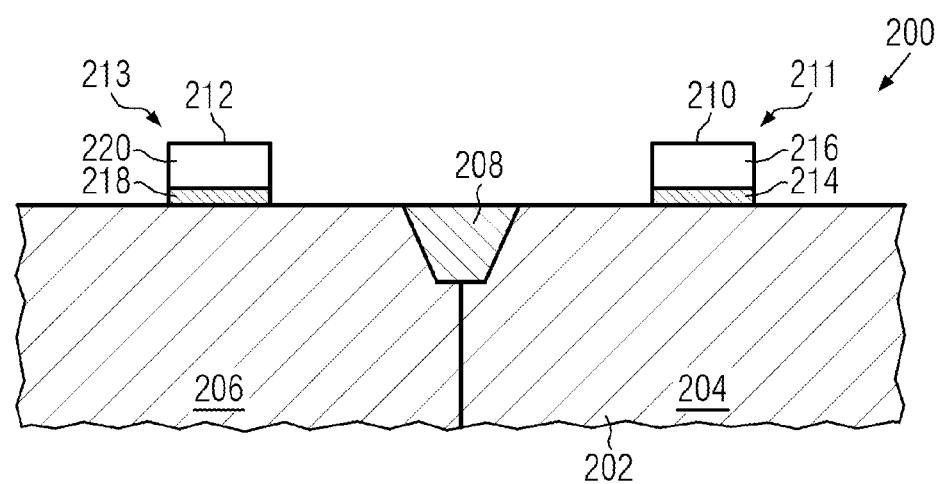

The fabrication of CMOS IC 200 continues as illustrated in FIG. 2b by forming a gate electrode structure 210 of a PMOS transistor 211 overlying the PMOS region 204 and a gate electrode structure 212 of an NMOS transistor 213 overlying the NMOS region 206. The gate electrode structure 210 of the PMOS transistor 211 includes a gate insulator 214 and a conductive gate electrode 216. The gate electrode structure 212 of the NMOS transistor 213 includes a gate insulator 218 and a conductive gate electrode 220. The gate insulators 214 and 218 may be silicon dioxide, a high dielectric constant insulator with a dielectric constant k greater than 4, any other insulating material, or combinations thereof selected in accordance with the integrated circuit function being implemented. The gate insulators 214 and 218 may be, but need not necessarily be, of the same material. Conductive gate electrodes 216 and 220 may be, for example, polycrystalline silicon, metal, any other conductive material, or combinations thereof. Again, the materials selected for the conductive gate electrodes 216 and 220 may be selected in accordance with the integrated circuit function being implemented. The two conductive gate electrodes 216 and 220 may comprise the same or different materials.

Figure 2C:
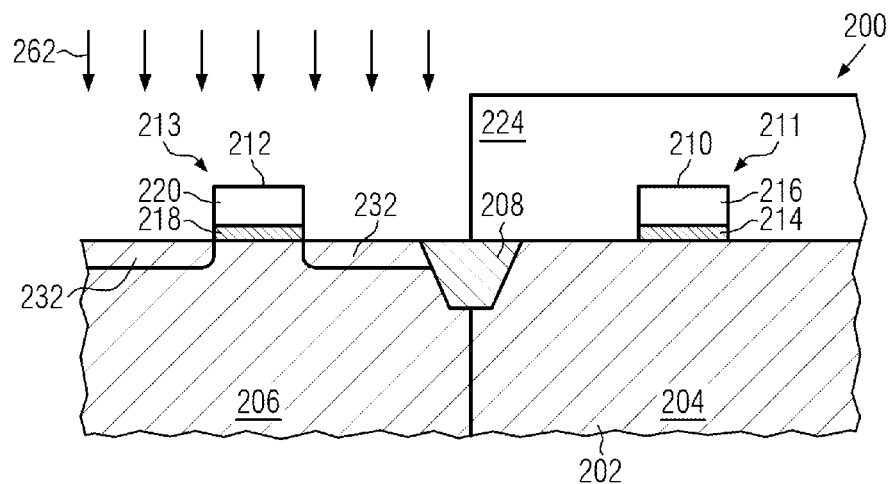

As illustrated in FIG. 2c, the fabrication of CMOS IC 200 continues, in accordance with one embodiment, by forming an etch mask pattern 224 over the PMOS region 204. The etch mask pattern 224 may be photolithographically patterned as the person skilled in the art appreciates. The etch mask pattern 224 may be, for example, a patterned layer of deposited oxide or photoresist material or other insulating material. By performing an implantation process 262, source and drain extension regions 232 are formed in alignment with the gate electrode structure 212 in the NMOS region 206. The source and drain extension regions 232 may border on the STI 208 as illustrated in FIG. 2c. Alternatively or additionally, a halo implantation process may be performed in order to adjust the threshold voltage and punch-through properties of the NMOS transistor 213 under fabrication. The person skilled in the art will appreciate that a lateral offset distance between source and drain extension regions 232 and/or halo regions (not illustrated) to the gate electrode structure 212 may be adjusted by one or more dummy spacers and/or liner spacers (not illustrated). The lateral offset of the source and drain extension regions 232 may be further adjusted by a subsequent anneal process allowing the implanted dopants to diffuse to a certain degree under the gate electrode structure 212. The person skilled in the art will appreciate that the PMOS region 204 is protected from the implantation process 262 forming the source and drain extension regions 232 and/or halo regions (not illustrated) in the NMOS region 206.

Figure 2D:
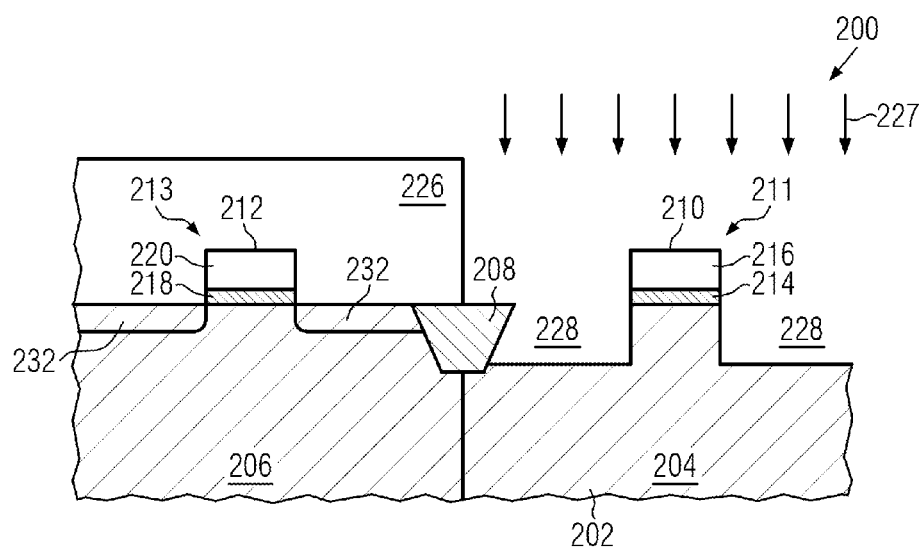

After formation of source and drain extension regions 232 and/or halo regions (not illustrated) in the NMOS region 206, the fabrication of CMOS IC 200 continues, in accordance with one embodiment, as illustrated in FIG. 2d. A masking pattern 226 may be formed over the NMOS region 206 by photolithography techniques so as to cover and protect the NMOS region 206 during subsequent processing. The masking pattern 226 may be, for example, a patterned layer of deposited oxide or photoresist material or other insulating material. While the masking pattern 226 overlies the NMOS region 206, an anisotropic etch process 227, for example a reactive ion etch (RIE) process, may be performed in order to form recesses 228 in the PMOS region 204 in alignment with the gate electrode structure 210 of the PMOS transistor 211. The person skilled in the art appreciates that the recesses 228 may border on the STI 208 as shown in FIG. 2d. The masking pattern 226 is covering the NMOS transistor 213 and the NMOS region 206 during the anisotropic etching process 227.

Figure 2E:
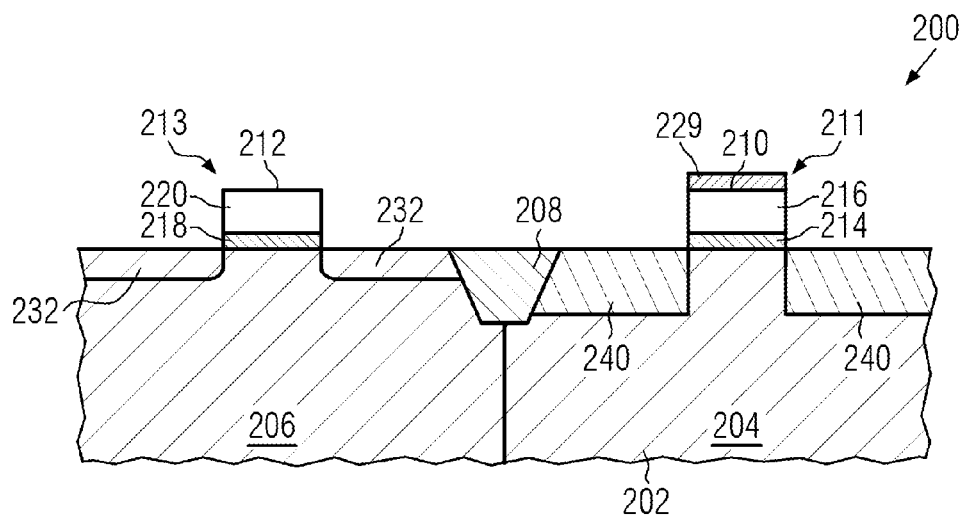

Following the etching of the recesses 228, the recesses 228 are filled with silicon germanium material to form embedded silicon germanium (eSiGe) 240 as illustrated in FIG. 2e and the masking pattern 226 may be removed. Silicon germanium material may be grown by a process of selective epitaxial growth as is well known to those of skill in the art. In the selective epitaxial growth process, the growth conditions may be adjusted such that the silicon germanium material grows only on crystalline material. According to some illustrative examples, a layer 229 of silicon germanium material may be formed on the gate electrode structure 210. This does not pose any limitation to the present disclosure and, alternatively, the layer 229 may represent a capping layer such that no silicon germanium material is deposited on the gate electrode structure 210. The crystalline material bounding recess 228 acts as a nucleation site for the growth of single crystalline silicon germanium. If the conductive gate electrode 216 is of polycrystalline silicon, the polycrystalline silicon acts as a nucleation site for the deposition of polycrystalline silicon germanium 240. Because of the growth process being selective, no silicon germanium material grows on insulating layers, such as the STI region 208. The person skilled in the art will understand that eSiGe 240 may not be further doped or, alternatively, may be in situ doped, for example by boron ions.

According to some illustrative embodiments, eSiGe 240 may have a germanium content of 2-75% and preferably of 30-50% and more preferably of 30-40%. According to alternative illustrative embodiments, the germanium content may be in a range of 5-30% and preferably in a range of 10-25% and more preferably from 10-20%.

The person skilled in the art will appreciate that eSiGe 240 may have a uniform germanium content profile or alternatively may show a varying germanium content profile. In embodiments showing a varying germanium content profile, the germanium content of eSiGe 240 along a depth direction, in particular along a direction parallel to a normal direction of the substrate surface, may vary in order to form a desired content profile such that the germanium content increases with increasing depth along the depth direction. In particular, an accordingly varying germanium content profile may have a comparatively low germanium content closer to an upper surface level of the semiconductor substrate and a comparatively high germanium content closer to the ground of the recess (228 in FIG. 2d).

In some illustrative embodiments herein, the varying germanium content profile may represent a graded content profile, for example eSiGe 240 may actually comprise different layers of silicon germanium, each layer of silicon germanium having a predetermined content of germanium. For example, an illustrative graded content profile may be given by a two layer stack of silicon germanium layers, a first layer of silicon germanium having a germanium content of 25-75% and preferably of 30-50% and more preferably of 30-40% and a second layer of silicon germanium being disposed on the first layer, wherein the second layer of silicon germanium may have a germanium content in a range of 5-30% and preferably in a range of 10-25% and more preferably in a range of 10-20%. According to an illustrative example, the second silicon germanium layer may have a thickness in the range of 1-20 nm or in the range of 5-15 nm or in the range of 5-10 nm or of around 5 nm. The person skilled in the art will appreciate that other graded profiles and/or thicknesses may be implemented, for example, by multiple layer stacks.

Figure 2F:
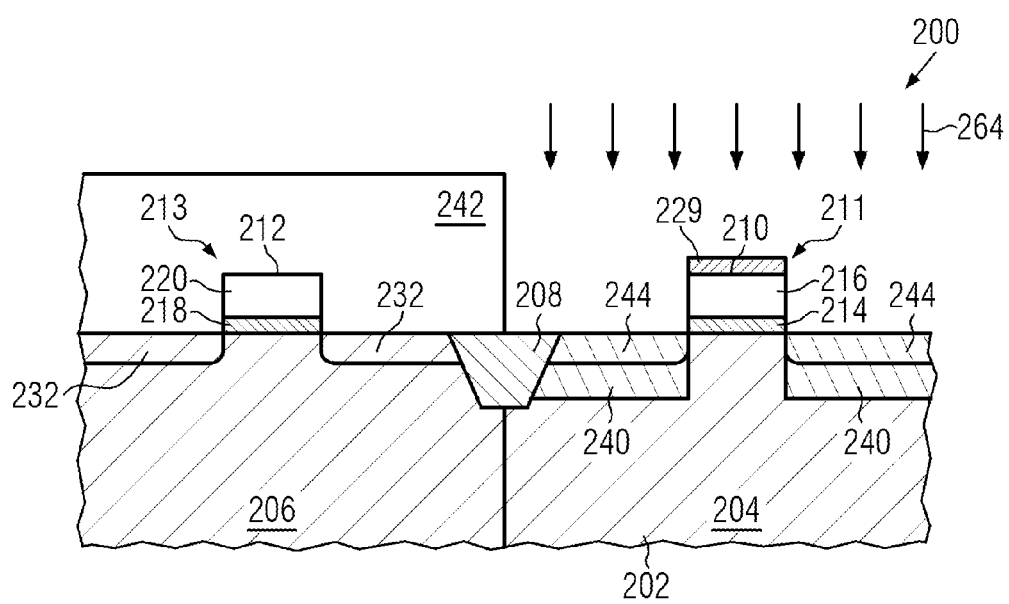

As illustrated in FIG. 2f, source and drain extension regions 244 may be formed in accordance with an embodiment, the source and drain extension regions 244 being in alignment with the gate electrode structure 210 of the PMOS transistor 211 in the PMOS region 204 such that the source and drain extension regions 244 are formed within the embedded silicon germanium eSiGe 240. The person skilled in the art appreciates that formation of the source and drain extension regions 244 in the PMOS region 204 may be achieved by forming a masking pattern 242 over the NMOS region 206 covering the NMOS transistor 213. The masking pattern 242 may be formed by known photolithography techniques. The masking pattern 242 may be, for example, a patterned layer of deposited oxide or photoresist material or other insulating material. Subsequent to forming the masking pattern 242, an implantation process 264 may be performed for forming source and drain extension regions 244 within the eSiGe 240 in the PMOS region 204. The person skilled in the art appreciates that the source and drain extension regions 244 formed by the implantation process 264 use the gate electrode structure 210, often with thin sidewall spacers (not shown), as implantation masks for forming the source and drain extension regions 244 in a self-aligning manner.

Figure 2G:
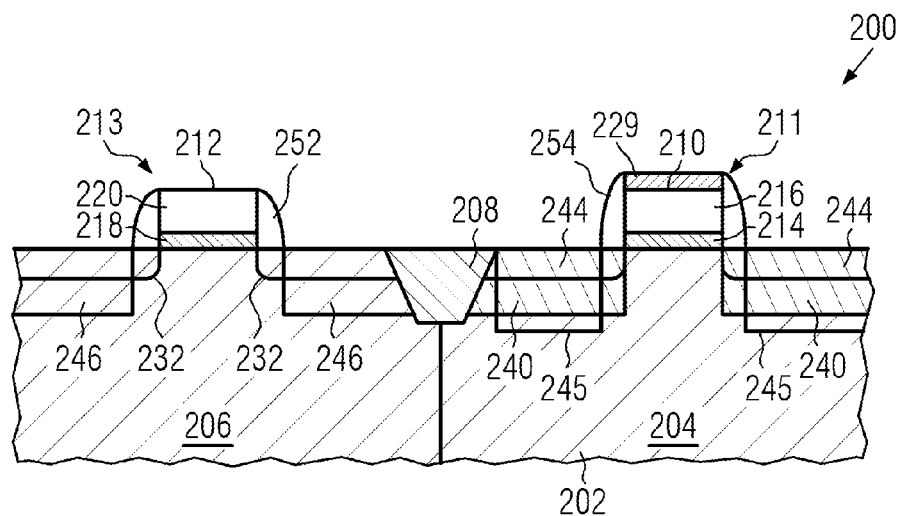

The fabrication of CMOS IC 200 continues as illustrated in FIG. 2g. Subsequent to removing the masking pattern 242 over the NMOS region 206, sidewall spacers 252 and 254 may be formed adjacent to the gate electrode structures 210 and 212. In accordance with an embodiment, the sidewall spacers 252 and 254 may be formed by blanket depositing a layer of sidewall spacer material (not illustrated) and subsequently etching by an anisotropic etch process.

Next, source and drain regions may be formed within each of the NMOS region 206 and the PMOS region 204. The source and drain regions 246 and 245 may be formed, for example, by ion implantation processes. For the PMOS transistor 211, source and drain regions 245 may be formed by implanting boron ions into the PMOS region 204 and into and through the eSiGe 240. Similarly, source and drain regions 246 of the NMOS transistor 213 may be formed by implanting phosphorus or arsenic ions into the NMOS region 206. If the semiconductor substrate 202 is an SOI substrate, deep source and drain regions may be designed to extend from the substrate surface to the underlying oxide layer according to illustrative embodiments. As illustrated in FIG. 2g, source and drain regions 246 of the NMOS transistor 213 and source and drain regions 245 of the PMOS transistor 211 may be formed in alignment with the respective sidewall spacers 252 and 254. The person skilled in the art will appreciate that the source and drain regions 246 of the NMOS transistor 213 and the source and drain regions 245 of the PMOS transistor 211 may border on the STI region 208 in some embodiments as illustrated in FIG. 2g.

Figure 3A:
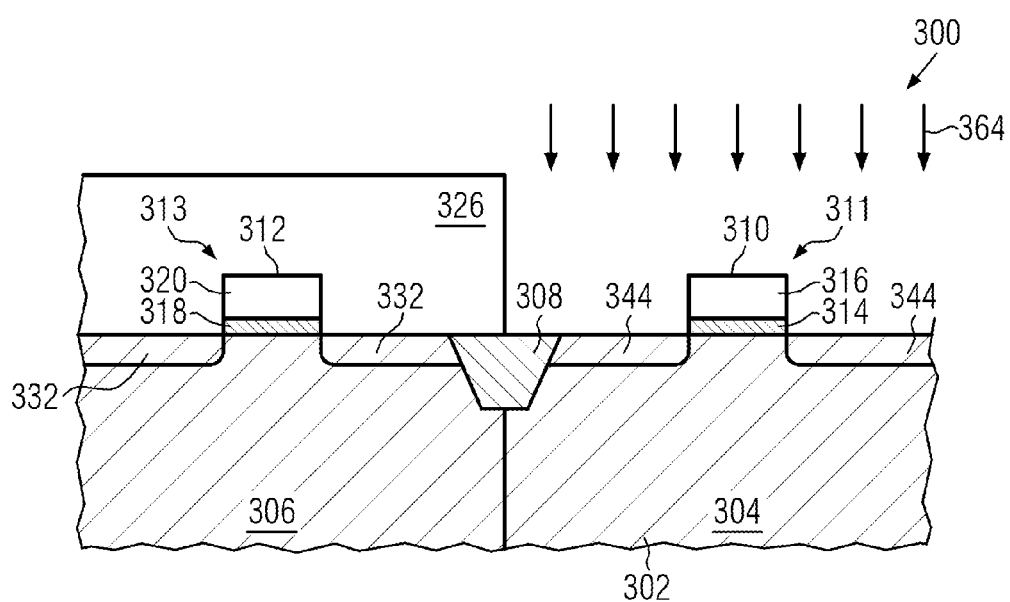
FIGS. 3a-3e schematically illustrate alternative embodiments of the present disclosure with regard to methods for fabricating CMOS integrated circuit structures according to aspects of the present disclosure and semiconductor device structures according to alternative embodiments of the present disclosure.

Further embodiments of the present disclosure will be described with regard to FIGS. 3a-3e. FIG. 3a illustrates a CMOS IC 300 during processing phases subsequent to the processing of the CMOS IC 200 shown in FIG. 2b. Following the formation of a gate electrode structure 310 of a PMOS transistor 311 in a PMOS region 304 and of a gate electrode structure 312 of an NMOS transistor 313 in an NMOS region 306, source and drain extension regions 332 and 344 are formed in the PMOS region 304 and in the NMOS region 306, respectively, in alignment with the respective gate electrode structures 310 and 312 and an STI region 308 as shown in FIG. 3a. Alternatively or additionally, halo regions (not illustrated) to tailor threshold voltage and punch-through may be formed within the NMOS region 306 and/or the PMOS region 304.

According to some illustrative embodiments, formation of source and drain extension regions 332 and 344 may be achieved by forming a first masking pattern (not illustrated) over one of the PMOS region 304 and the NMOS region 306 for masking a first region and leaving a second region uncovered, performing a first implantation process for forming source and drain extension regions in the second region, removing the masking pattern covering the first region, forming a second masking pattern over the second region for covering the second region and leaving the first region uncovered, performing a second implantation process for forming source and drain extension regions in the first region and removing the masking pattern over the second region. The person skilled in the art will appreciate that an according process sequence may alternatively or additionally be performed for implanting halo regions (not illustrated).

An illustrative embodiment is illustrated in FIG. 3a showing a masking pattern 326 formed over the NMOS region 306 covering the NMOS transistor 313 and leaving the PMOS region 302 uncovered subsequently to forming source and drain extension regions 332 and 344 in the NMOS region 306 as described above. The masking pattern 326 may be formed by means of photolithographic techniques. The person skilled in the art appreciates that the masking pattern 326 may be, for example, a patterned layer of deposited oxide or photoresist material or any other insulating material. After forming the masking pattern 326, an implantation process 364 is performed for forming source and drain extension regions 344 in the PMOS region 304. The person skilled in the art understands that the source and drain extension regions 344 in the PMOS region 304 are aligned to the gate electrode structure 310 of the PMOS transistor 311 and border on the STI region 308.

Figure 3B:
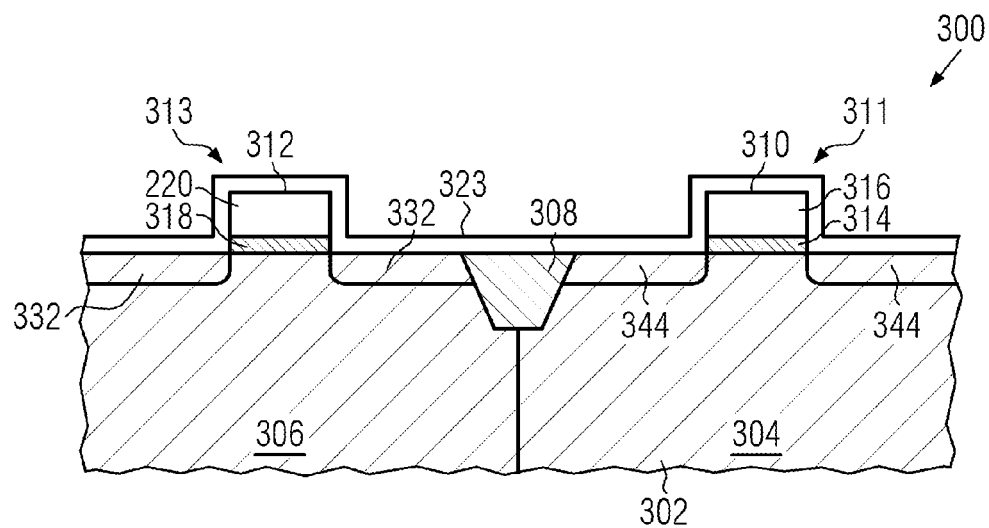

The fabrication of CMOS IC 300 continues in forming sidewall spacers to the gate electrode structures 310 and 312 of PMOS transistor 311 and NMOS transistor 313. In accordance with an illustrative embodiment, sidewall spacers are formed by depositing a sidewall spacer material 323 over the PMOS region 304 and the NMOS region 306. FIG. 3b shows the CMOS IC 300 after an according deposition process (not illustrated) has been performed. The sidewall spacer material may be one of an oxide, nitride or any other suitable insulator, and may be formed by a blanket deposition process in accordance with the illustrative embodiment as shown in FIG. 3b.

Figure 3C:
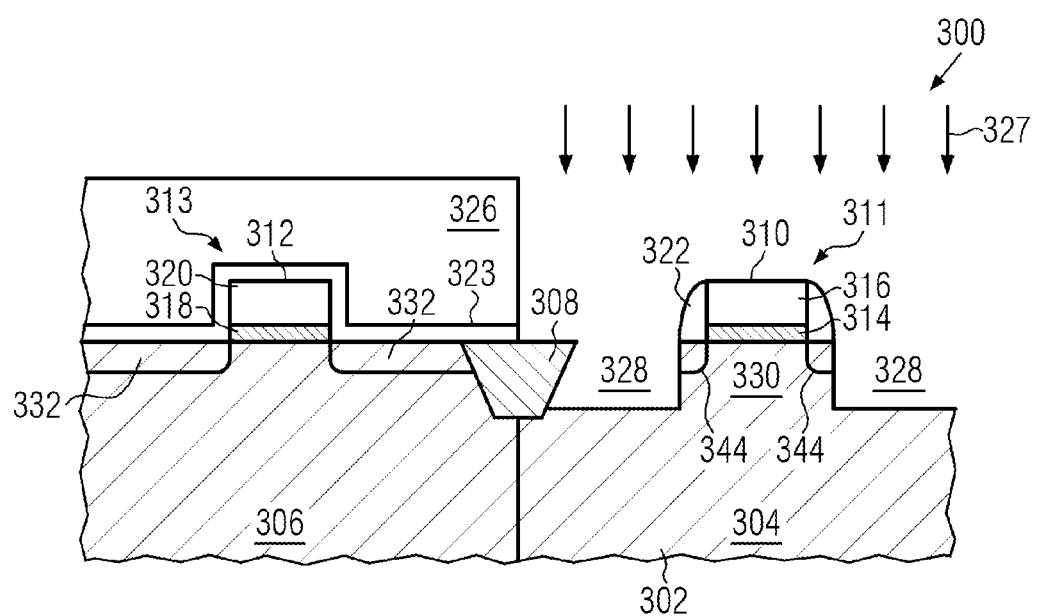

As illustrated in FIG. 3c, the fabrication of CMOS IC 300 continues, in accordance with an illustrative embodiment, by performing an etch process 327 for forming sidewall spacers 322 on the sidewalls of the gate electrode structure 310 of the PMOS transistor 311. The sidewall spacers 322 may be formed by performing an anisotropic etch process, such as reactive ion etching (RIE), subsequent to a blanket deposition process as illustrated in FIGS. 3a and 3b. Although FIG. 3c shows a single sidewall spacer 322 at each side of the gate electrode structure 310 of the PMOS transistor 311, the person skilled in the art understands that various process implementations may require one or more separate spacers and an according number of individual sidewall spacers may be formed. During etching the sidewall spacers 322, the sidewall spacer material 323 overlying the NMOS region 306 may be protected from being etched by the etch process 327 by means of a patterned etch mask 326. The patterned etch mask 326 may be formed by photolithography techniques. The person skilled in the art appreciates that the patterned etch mask 326 may be, for example, a patterned layer of deposited oxide or photoresist or other insulating material.

In accordance with this embodiment, recesses 328 may be subsequently formed in the PMOS region 304 by using the gate electrode structure 310 and its associated sidewall spacers 322 and the STI region 308 as an alignment structure. The person skilled in the art appreciates that the patterned etch mask 326 protects the NMOS region 306 during the recess etch process 327 as illustrated in FIG. 3c.

Figure 3D:
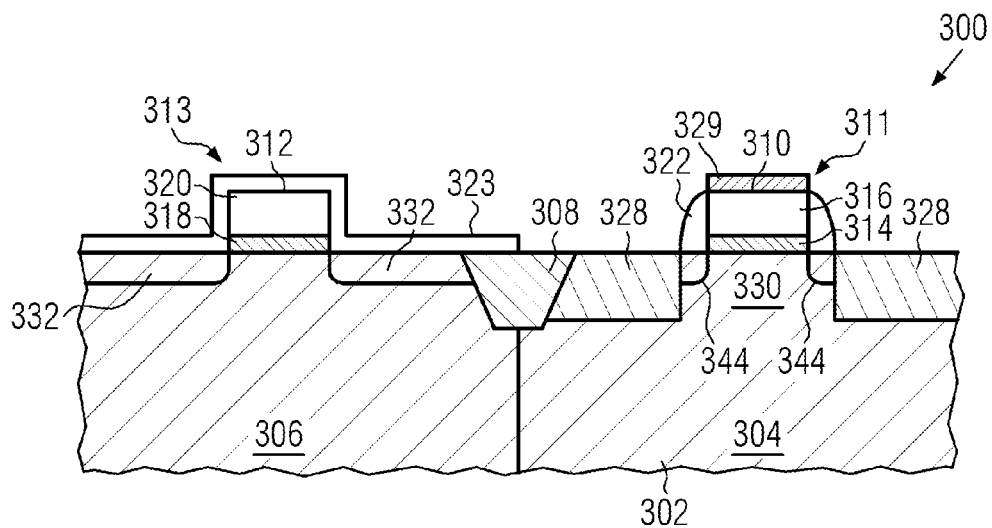

Following the etching of the recesses 328, the etch mask 326 is removed and the recesses 328 are filled with a silicon germanium material for forming embedded silicon germanium (eSiGe) 328 as illustrated in FIG. 3d. According to some illustrative embodiments herein, the eSiGe 328 may be grown by a process of selective epitaxial growth as is well known to those of skill in the art. In the selective epitaxial growth process, the growth conditions may be adjusted such that silicon germanium (SiGe) grows only on crystalline material.

According to some illustrative examples, a layer 329 of silicon germanium material may be formed on the gate electrode structure 310. This does not pose any limitation to the present disclosure and, alternatively, the layer 329 may represent a capping layer such that no silicon germanium material is deposited on the gate electrode structure 310. Herein, the crystalline material bounding recess 328 acts as a nucleation site for the growth of single crystalline silicon germanium. If the conductive gate electrode 316 of the gate electrode structure 310 is of polycrystalline silicon material, the polycrystalline silicon acts as a nucleation site for the deposition of polycrystalline silicon germanium material. As the growth process is selective, no silicon germanium material grows on insulating layers such as sidewall spacers 322, the remaining portion of the sidewall spacer material 323 overlying NMOS region 306 and the STI region 308. The person skilled in the art will understand that eSiGe 328 may not be further doped or, alternatively, may be in situ doped, for example by boron ions.

The person skilled in the art appreciates that the recesses 328 and subsequently the eSiGe 328 formed in the recesses 328 are aligned to the semiconductor substrate 302, therefore, portions of the source and drain extension regions 344 in the PMOS region 304 being aligned with the gate electrode structure 310 of the PMOS transistor 311 remain under the gate electrode structure 310 as illustrated in FIGS. 3c and 3d. Furthermore, the person skilled in the art understands that the source and drain extension regions 344 in the PMOS region 304 may adjust the gate length of the PMOS transistors 311.

The eSiGe 328 formed in the recesses 328 (FIG. 3c) is aligned with the gate electrode structure 310 of the PMOS transistor 311 and formed at the ends of a channel region 330 of PMOS transistor 311 underlying the gate electrode structure 310 of PMOS transistor 311. Silicon germanium material has a larger lattice constant than the host silicon material and, hence, eSiGe 328 imparts a lateral compressive stress on the channel region 330. The lateral compressive stress on the channel region 330 of PMOS transistor 311 increases the mobility of majority carrier holes in the channel region 330 and, thus, serves to improve the performance of the transistor.

According to some illustrative embodiments, eSiGe 328 may have a germanium content of 25-75% and preferably of 30-50% and more preferably of 30-40%. According to alternative illustrative embodiments, the germanium content may be in a range of 5-30% and preferably in a range of 10-25% and more preferably from 10-20%.

The person skilled in the art will appreciate that eSiGe 328 may have a uniform germanium content profile or, alternatively, may show a varying germanium content profile. In embodiments showing a varying germanium content profile, the germanium content of eSiGe 328 along a depth direction (along a direction parallel to a normal direction of the substrate surface) may vary in order to form a desired content profile such that the germanium content increases with increasing depth along the depth direction. In particular, an according varying germanium content profile may have a comparatively low germanium content closer to an upper surface level of the semiconductor substrate and a comparatively high germanium content at the ground of the recess (328 in FIG. 3c).

In some illustrative embodiments herein, the varying germanium content profile may represent a graded content profile, for example eSiGe 328 may actually comprise different layers of silicon germanium, each layer of silicon germanium having a predetermined content of germanium. For example, an illustrative graded content profile may be given by a two layer stack of silicon germanium layers, a first layer of silicon germanium having a germanium content of 25-75% and preferably of 30-50% and more preferably of 30-40% and a second layer of silicon germanium disposed on the first layer, wherein the second layer of silicon germanium may have a germanium content in a range of 5-30% and preferably in a range of 10-25% and more preferably in a range of 10-20%. According to an illustrative example, the second silicon germanium layer may have a thickness in the range of 1-20 nm or in the range of 5-15 nm or in the range of 5-10 nm or around 5 nm. The person skilled in the art will appreciate that other graded profiles and/or thicknesses may be implemented, for example, by multiple layer stacks.

According to some illustrative embodiments, the sidewall spacer 322 and the remaining portion of sidewall spacer forming material 323 may be removed after forming eSiGe 328. In this case, the sidewall spacer 322 may be regarded as a dummy sidewall spacer. This does not pose any limitation on the present disclosure and the person skilled in the art will appreciate that the sidewall spacer 322 may remain adjacent to the gate electrode structures 310 and 312.

Figure 3E:
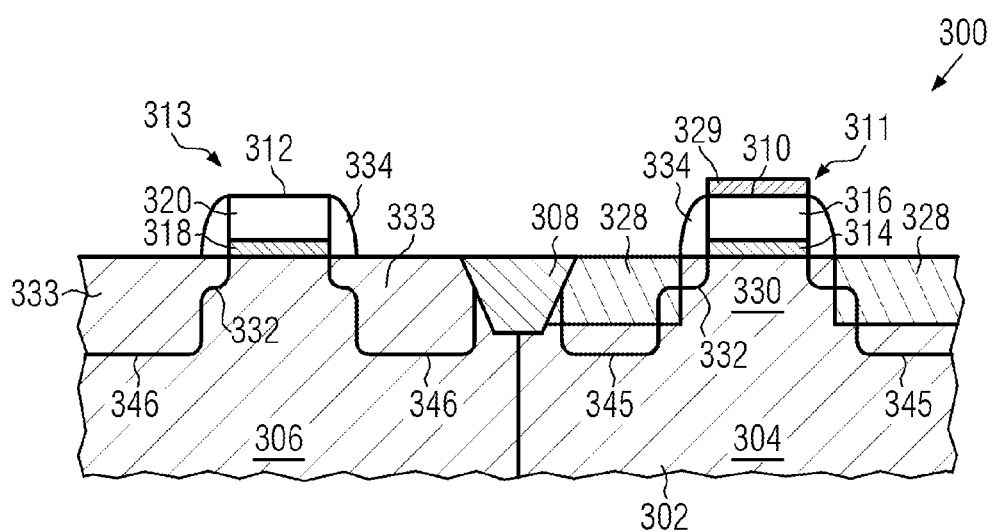

As illustrated in FIG. 3e, source and drain regions may be subsequently formed in alignment with the gate electrode structures 310 and 312 in the PMOS region 304 and the NMOS region 306. According to some illustrative embodiments, the source and drain regions may be formed, for example, by appropriate ion implantation processes. With regard to the PMOS transistor 311, source and drain regions 332 may be formed by implanting boron ions into the PMOS region 304 and into and through eSiGe 328. Similarly, source and drain regions 333 of the NMOS transistor 313 may be formed by implanting phosphorus or arsenic ions into the NMOS region 306. The source and drain regions 332 and 333 of the PMOS transistor 311 and the NMOS transistor 313 are in alignment with the source and drain extension regions 344 and 332 (FIG. 3d). The person skilled in the art appreciates that deep source and drain regions may be formed by additional ion implantations using the gate electrode structures 310 and 312 together with additional sidewall spacers 334 as ion implantation masks. As before, sidewall spacers 334 may be formed by blanket depositing a layer of sidewall spacer forming material and then etching by an anisotropic etch process. The person skilled in the art will appreciate that the sidewall spacer 334 may be additionally or alternatively formed with regard to sidewall spacer 322 as shown in FIG. 3c. In cases that the sidewall spacers 334 are additionally formed, the person skilled in the art will understand that the sidewall spacer 334 may be formed on the sidewall spacer 322. If semiconductor substrate 302 is an SOI substrate, the deep source and drain of the transistor structures may by designed to extend from the substrate surface to the underlying oxide layer.

The present disclosure provides illustrative embodiments which are described with regard to the figures which illustrate IC structures having a PMOS region and an NMOS region separated by an STI region. The person skilled in the art will appreciate that this is only for illustrative purposes and does not pose any limitation on the present disclosure and the accordingly described embodiments. IC structures may omit an according STI region or PMOS regions and NMOS regions as described may not even be adjacent to each other but instead may be spaced apart such that one or more further transistor regions are disposed in between.

The present disclosure describes some illustrative embodiments with regard to a selective growth of silicon germanium material. However, this does not pose any limitation on the present disclosure and the person skilled in the art appreciates that germanium may be implanted instead. It is noted that implanting germanium may allow for germanium content profiles having a more or less smoothly varying germanium content or that desired content values may be implemented at desired depths when using appropriate implantation energies with sufficiently sharp energy distributions.

The person skilled in the art will appreciate that the present disclosure provides methods for forming a CMOS integrated circuit structure and a semiconductor device structure that shows a reduced loss of active silicon around the PMOS transistor gate electrode structure or even avoids any loss of active silicon around the PMOS transistor gate electrode structure. Therefore, the parasitic resistance of the accordingly fabricated CMOS transistor is reduced and the switching speed increased.

The person skilled in the art appreciates that several embodiments of the present disclosure propose flows for CMOS fabrication in which embedding silicon germanium material is shifted to a later position, particularly after implanting source and drain extension regions and/or halo regions in the NMOS transistor. Therefore, the number of implantations and consequently the number of strip and cleaning processes to which the PMOS transistors having embedded silicon germanium are exposed is reduced and the amount of material loss in the embedded silicon germanium is reduced, if not avoided. The person skilled in the art will appreciate that, depending on the design of the device under fabrication, the implemented IC may not only include one type of logic circuitry, such as SRAM, but may also include other logic devices, such as thick gate oxide devices for input/output applications and special devices with lower or higher threshold voltages, so-called low-Vth or high-Vth transistors etc. According to some illustrative examples, thick gate oxide devices may be processed first and then SRAM devices and/or special devices may be processed. In consequence, the actual number of implantations performed in typical CMOS fabrication, flows differing from 6 to 10 different implantation processes for source and drain extension/halo implantations, silicon germanium material is exposed to, is substantially reduced as opposed to typical CMOS fabrication flows. According to some illustrative examples of the present disclosure, silicon germanium material may be exposed to 0 to 3 or 4 masking processes.

The person skilled in the art will appreciate that embodiments of the present disclosure are applicable to a variety of circuit designs implemented on chips. Illustrative circuit designs may include at least one of SRAM, thick gate oxide devices and special devices with higher or lower threshold voltages, so-called low-Vth or high-Vth transistors and so on. The person skilled in the art will understand that it is beneficial to place implantations of source and drain extension regions and/or halo regions of the most critical logic devices, such as high performance logic devices, as the last step and to do the less critical, such as thick oxide implants, first, since then the doping loss which comes along with the active silicon loss becomes smaller.

The present disclosure provides methods for forming CMOS integrated circuit structures comprising performing a first implantation process for performing at least one of a halo implantation process and a source and drain extension implantation process into a region of a semiconductor substrate and then forming a stressor region in another region of the semiconductor substrate, the stressor region being etched at a higher rate when exposed to an etch chemistry than adjacent silicon substrate being exposed to the etch chemistry. The person skilled in the art understands that an etch rate may be defined by a relation between the amount of material removed by an etch process and a time interval during which the amount of material is removed in the etch process. In special illustrative embodiments herein, the stressor region is formed in a PMOS region of the semiconductor substrate.

The person skilled in the art will understand that the present disclosure proposes a very easy modification of present CMOS fabrication flows which allow for highly valued improvements of present integrated circuit structures and future integrated circuit structures as the proposed fabrication flow is identical to the conventional one after spacer 1 formation. Consequently, a fabrication flow, as described with regard to the present disclosure, shows a good compatibility with conventional process flows and may, therefore, very easily be introduced into conventional process flows. The person skilled in the art will appreciate that, in some illustrative embodiments, the processes as described with regard to the figures may continue with performing a final activation anneal, for example a rapid thermal anneal (RTA) process, and silicidation and contact forming processes and/or other conventional process flows.

The person skilled in the art will appreciate that various aspects of the present disclosure being described with regard to the figures do not pose any limitation to the disclosed subject matter which is defined in the appended claims. It is understood, that in addition to the explicitly described embodiments, a vast variety of modifications to processing details is possible without being explicitly described, though not departing from the gist of the present disclosure and the scope of protection as defined in the appended claims. In the above description, numerous specific details are set forth such as, for example thicknesses, in order to provide a more thorough understanding of the present disclosure. Those skilled in the art will realize that the numerous specific details as provided may be equipment specific and may accordingly vary from one brand of equipment to another. It will be obvious, however, to one skilled in the art that the present disclosure may be practiced without these details. In other instances, well-known processes have not been described in detail in order to not unnecessarily obscure the present disclosure.

Although this invention has been described relative to specific insulating materials, conductive materials and deposited materials and etching of these materials, it is not limited to the specific materials but only to their specific characteristics, such as conformal and non-conformal, and capabilities, such as depositing and etching, and other materials may be substituted as is well understood by those skilled in the arts after appreciating the present disclosure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a CMOS integrated circuit structure, comprising:

providing a semiconductor substrate with a first transistor region and a second transistor region, each having a gate electrode structure;

forming a first masking structure over said semiconductor substrate, masking said first transistor region while exposing at least a portion of said second transistor region;

performing a first implantation process comprising at least one of a halo implantation and a source and drain extension implantation into the exposed portion of said second transistor region;

removing said first masking structure; and thereafter forming a second masking structure over said semiconductor substrate, masking said second transistor region while exposing at least a portion of said first transistor region;

forming a stressor portion within the exposed portion of said first transistor region; and forming N-type source and drain regions in said second transistor region.

2. The method of claim 1, further comprising, after the stressor portion formation, forming a spacer structure adjacent to said gate structures and performing a source and drain implantation process for forming said N-type source and drain in said second transistor region.

3. The method of claim 1, wherein said stressor portion is formed after performing said first implantation process and before performing a second implantation process comprising at least one of source and drain extension implantation and halo implantation into said first transistor region.

4. The method of claim 3, wherein forming said stressor portion comprises etching a recess structure into the exposed portion of said first region and filling said recess structure with a strain-inducing semiconductor material.

5. The method of claim 4, wherein said strain-inducing semiconductor material comprises germanium.

6. The method of claim 1, further comprising performing a second implantation process comprising at least one of a halo implantation and a source and drain extension implantation into said first transistor region before forming said stressor portion in said first transistor region.

7. The method of claim 6, wherein forming said stressor portion comprises etching a recess structure into the exposed portion of said first region and filling said recess structure with a strain-inducing semiconductor material.

8. A method of forming a CMOS integrated circuit structure, comprising:
providing at least one P-well region and at least one N-well region in a semiconductor substrate;
forming a first mask over said at least one N-well region, said first mask exposing at least a portion of said at least one P-well region;
performing a first implantation process for forming at least one of halo regions and source and drain extension regions in the exposed portion of said at least one P-well region;
removing said first mask;
forming a second mask over said at least one P-well region, said second mask exposing at least a portion of said at least one N-well region; and
forming one or more stressor regions in the exposed portion of said at least one N-well region.

9. The method of claim 8, wherein forming said one or more stressor regions comprises forming one or more recesses in the exposed portion of said at least one N-well region and filling said one or more recesses with a strain-inducing material.

10. The method of claim 9, wherein said strain-inducing material comprises germanium.

11. The method of claim 8, further comprising performing a second implantation process for forming at least one of halo regions and source and drain extension regions in said at least one N-well region and thereafter forming said one or more stressor regions in said at least one N-well region.

12. The method of claim 8, further comprising performing a second implantation process for forming at least one of halo regions and source and drain extension regions, said source and drain extension regions at least partially mutually overlapping the one or more exposed portions of said at least one N-well region subsequent to forming said one or more stressor regions in said at least one N-well region.

13. The method of claim 8, wherein said CMOS integrated circuit structure to be formed comprises at least one of logic device structures and SRAM structures and thick gate oxide devices and devices with lower threshold voltages and devices with higher threshold voltages.

* * * * *